United States Patent

Ahn et al.

[11] Patent Number: 5,897,975
[45] Date of Patent: *Apr. 27, 1999

[54] PHASE SHIFT MASK FOR FORMATION OF CONTACT HOLES HAVING MICRO DIMENSION

[75] Inventors: Chang Nam Ahn; Hung Eil Kim, both of Kyoungki-do, Rep. of Korea

[73] Assignee: Hyundai Electronics Industries Co., Ltd., Kyoungki-Do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/563,769

[22] Filed: Nov. 28, 1995

[30] Foreign Application Priority Data

Dec. 2, 1994 [KR] Rep. of Korea ............... 94-32627

[51] Int. Cl.⁶ ............................................. G03F 9/00
[52] U.S. Cl. ........................................ 430/5; 430/313
[58] Field of Search ............................... 430/5, 313

[56] References Cited

U.S. PATENT DOCUMENTS

| | | | |
|---|---|---|---|
| 5,194,344 | 3/1993 | Cathey, Jr. et al. | 430/5 |
| 5,256,505 | 10/1993 | Chen et al. | 430/5 |
| 5,316,896 | 5/1994 | Fukuda et al. | 430/5 |
| 5,364,716 | 11/1994 | Nakagawa et al. | 430/5 |
| 5,415,952 | 5/1995 | Haruki et al. | 430/5 |
| 5,458,999 | 10/1995 | Szabo et al. | 430/5 |
| 5,573,634 | 11/1996 | Ham | 430/312 |
| 5,605,775 | 2/1997 | Watanabe | 430/5 |

FOREIGN PATENT DOCUMENTS

| | | |
|---|---|---|
| 58-168231 | 10/1983 | Japan . |
| 63-200152 | 8/1988 | Japan . |

*Primary Examiner*—Martin Angebranndt
*Attorney, Agent, or Firm*—Gary M. Nath; Nath & Associates

[57] ABSTRACT

A phase shift mask capable of forming contact holes having a micro dimension smaller than the wavelength of exposure light while being spaced at small intervals. The phase shift mask includes a quartz substrate, a chromium pattern formed on the quartz substrate along a peripheral edge of the quartz substrate, and a plurality of uniformly spaced phase shift layer patterns formed on a portion of the quartz substrate not covered with the chromium pattern, each of the phase shift layer patterns having a desired size. Each of the phase shift layer patterns has a line width larger than the wavelength of a light source used in a light exposure procedure.

4 Claims, 4 Drawing Sheets

PHASE SHIFT MASK FOR FORMATION OF CONTACT HOLES HAVING MICRO DIMENSION

BACKGROUND OF THE INVENTION

1. Field of the Invention

The present invention relates to contact masks, and more particularly to a phase shift mask having a multi-layer structure, fabricated by forming a plurality of uniformly spaced phase shift layers on a quartz substrate, capable of forming contact holes with a micro dimension smaller than the wavelength used in the light exposure procedure.

2. Description of the Prior Art

Typically, contact holes are formed using a chromium mask or phase shift mask. In the case of methods using the chromium mask to form a plurality of uniformly spaced contact holes having a micro dimension, the critical dimension of the contact holes is larger than the wavelength of exposure light. In some cases, contact holes formed using the chromium mask have a dimension larger than twice the wavelength of the exposure light. Meanwhile, the recent development of highly integrated semiconductor devices has resulted in the requirement of contact holes having a size smaller than the wavelength of the light source used in the light exposure procedure. However, it is difficult to form such contact holes because conventional chromium masks can not have a dimension smaller than the wavelength of the light source.

In order to solve the problem involved in the chromium mask, a phase shift mask has recently been proposed. Although this phase shift mask can form contact holes having a dimension smaller than the wavelength of exposure light, it can not form contact holes which are spaced at small intervals. Furthermore, this phase shift mask has a problem that its mask pattern can not be easily designed and fabricated.

SUMMARY OF THE INVENTION

Therefore, an object of the invention is to solve the above-mentioned problems encountered in the prior art and to provide a phase shift mask capable of forming contact holes having a micro dimension smaller than the wavelength of exposure light while being spaced at small intervals.

In accordance with one aspect, the present invention provides a contact mask comprising: a quartz substrate; a chromium pattern formed on the quartz substrate along a peripheral edge of the quartz substrate; and a plurality of uniformly spaced phase shift layer patterns formed on a portion of the quartz substrate not covered with the chromium pattern, each of the phase shift layer patterns having a desired size.

In accordance with another aspect, the present invention provides a contact mask comprising: a quartz substrate; a chromium pattern formed on the quartz substrate and provided with a plurality of horizontally elongated and vertically uniformly spaced slots each having a desired width; and a plurality of uniformly spaced phase shift layer patterns formed on a portion of the quartz substrate exposed through each of the slots, each of the phase shift layer patterns having a desired size.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
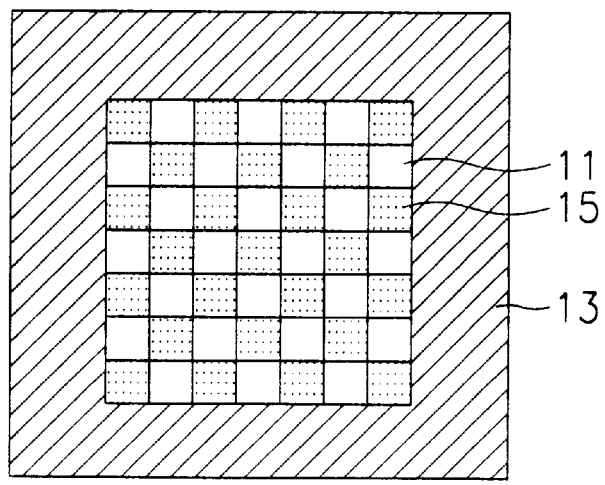
FIG. 1 is a plan view illustrating a phase shift mask according to a first embodiment of the present invention.

FIG. 1 is a plan view illustrating a phase shift mask according to a first embodiment of the present invention.

As shown in FIG. 1, the phase shift mask includes a quartz substrate 11 and a chromium pattern 13 formed with a desired width on the quartz substrate 11 along the peripheral edge of the quartz substrate 11. On the portion of the quartz substrate 11 not covered with the chromium pattern 13, a plurality of square phase shift layer patterns 15 are formed. The phase shift layer patterns 15 are arranged in a matrix fashion while being uniformly spaced from one another in each row and column. Each phase shift layer pattern 15 is in corner-to-corner contact with those arranged around it. Between neighboring phase shift layer patterns in each row and column, there is no phase shift layer pattern. In other words, the quartz substrate 11 is exposed between neighboring phase shift layer patterns in each row and column. When light is projected onto a wafer (not shown), the phase shift layer patterns 15 shift the phase of the incident light by 180°. On the other hand, the quartz substrate 11 shifts the phase of the incident light by 0°.

Figure 2:
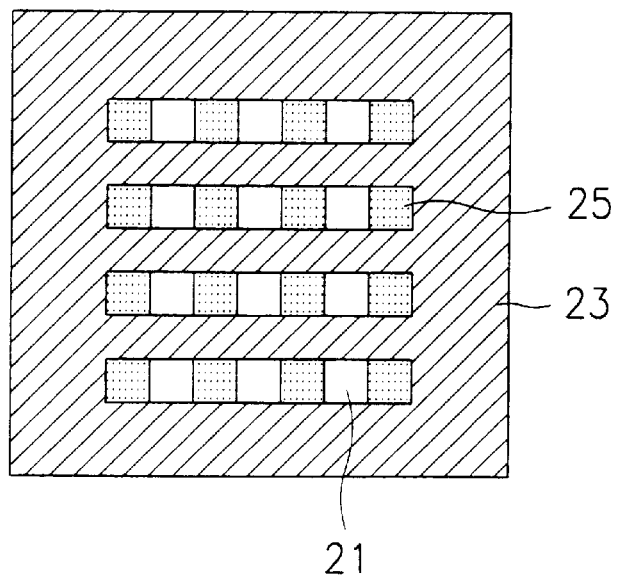
FIG. 2 is a plan view illustrating a phase shift mask according to a second embodiment of the present invention.

FIG. 2 is a plan view illustrating a phase shift mask according to a second embodiment of the present invention.

As shown in FIG. 2, the phase shift mask includes a quartz substrate 21 and a chromium pattern 23 formed on the quartz substrate 21. The chromium pattern 23 has a plurality of horizontally elongated and vertically uniformly spaced slots each having a desired width. On the portion of the quartz substrate 21 exposed through each slot of the chromium pattern 23, a plurality of uniformly spaced square phase shift layer patterns 25 are formed, as shown in FIG. 2. The phase shift layer patterns 25 formed at each slot of the chromium pattern 23 are vertically aligned with those formed at other slots of the chromium pattern 23.

Figure 3:
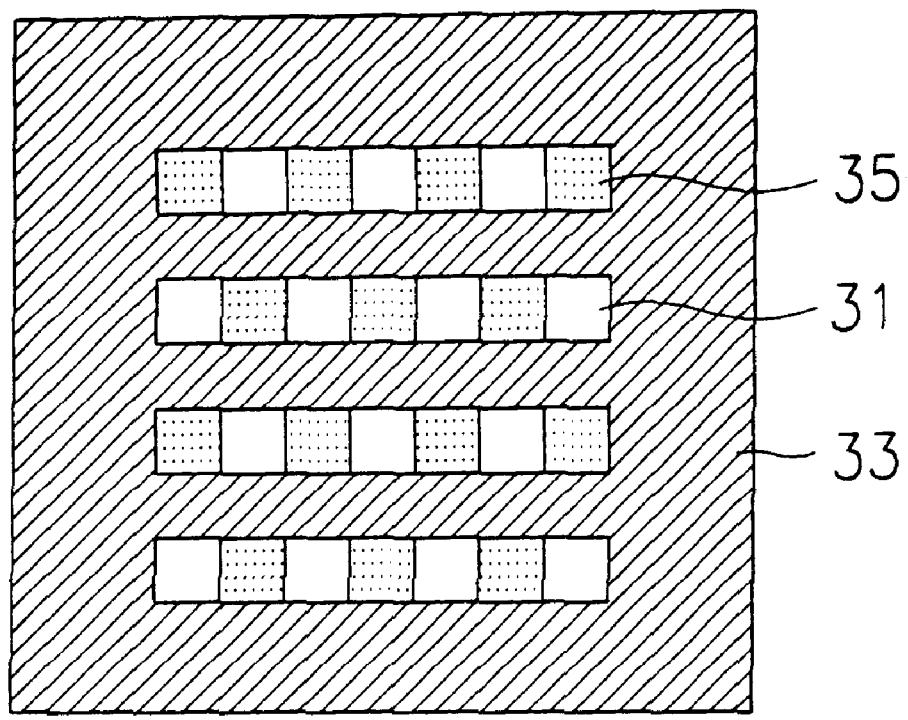
FIG. 3 is a plan view illustrating a phase shift mask according to a third embodiment of the present invention.

FIG. 3 is a plan view illustrating a phase shift mask according to a third embodiment of the present invention.

As shown in FIG. 3, the phase shift mask includes a quartz substrate 31 and a chromium pattern 33 formed on the quartz substrate 31. The chromium pattern 33 has a plurality of horizontally elongated and vertically uniformly spaced slots each having a desired width. On the portion of the quartz substrate 31 exposed through each slot of the chromium pattern 33, a plurality of uniformly spaced square phase shift layer patterns 35 are formed, as shown in FIG. 3. The phase shift layer patterns 35 formed at each slot of the chromium pattern 33 are vertically aligned with those formed at every second slot of the chromium pattern 33. In other words, the phase shift layer patterns 35 and exposed portions of the chromium pattern 33 are alternately arranged in both the horizontal and vertical directions.

Figure 4A:
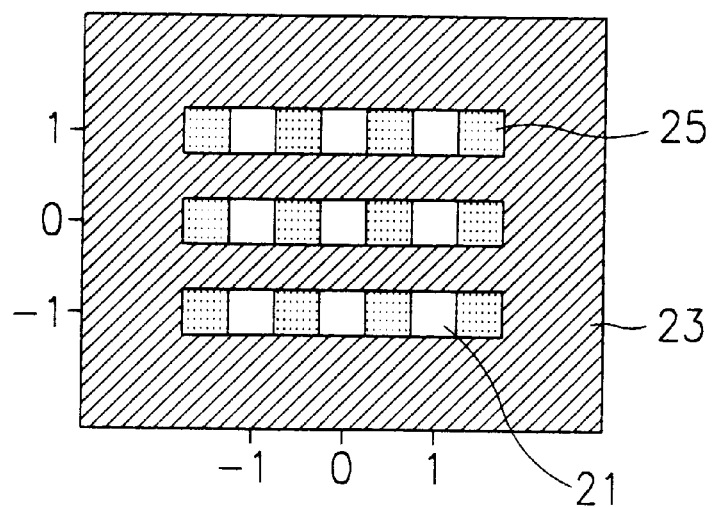
FIG. 4A is a plan view illustrating the layout of the phase shift mask having the pattern according to the second embodiment of the present invention.

FIG. 4A illustrates the layout of the phase shift mask having the pattern according to the second embodiment of the present invention. On the other hand, FIG. 4B illustrates the profile of light intensity established when a light exposure procedure is carried out using the mask pattern shown in FIG. 4A.

As shown in FIG. 4A, the phase shift layer patterns 25 formed on the portion of substrate not covered with the chromium pattern have a size of 0.5 $\mu$m by 0.5 $\mu$m and are spaced from neighboring ones by 0.5 $\mu$m.

Figure 4B:
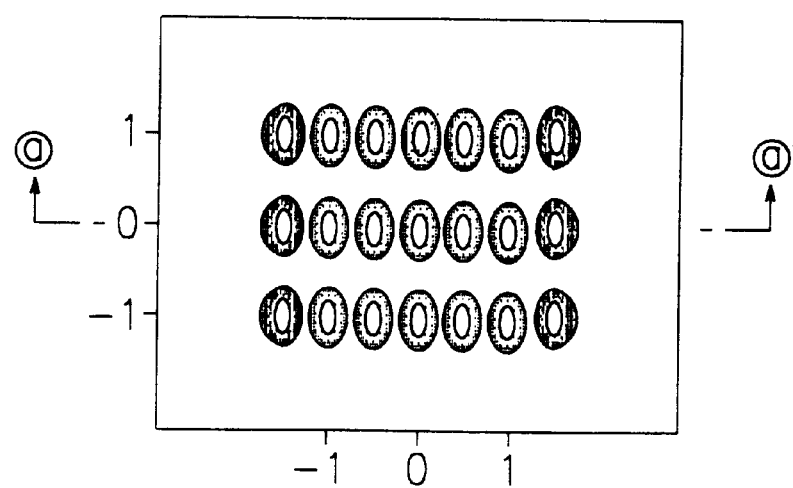
FIG. 4B is a schematic view illustrating the profile of light intensity established when a light exposure procedure is carried out using the mask pattern shown in FIG. 4A.

Referring to FIG. 4B, it can be found that light passing through the phase shift mask exhibits a strong intensity at the central portions of each phase shift layer pattern 25 and each exposed portion of the quartz substrate 21. The intensity of light is gradually reduced toward the boundary between each phase shift layer pattern 25 and each exposed portion of the quartz substrate 21 arranged adjacent to each other. This boundary prevents the light from passing therethrough. Accordingly, contact holes having a micro dimension can not be formed in the wafer (not shown) at regions where the light can not pass.

Figure 4C:
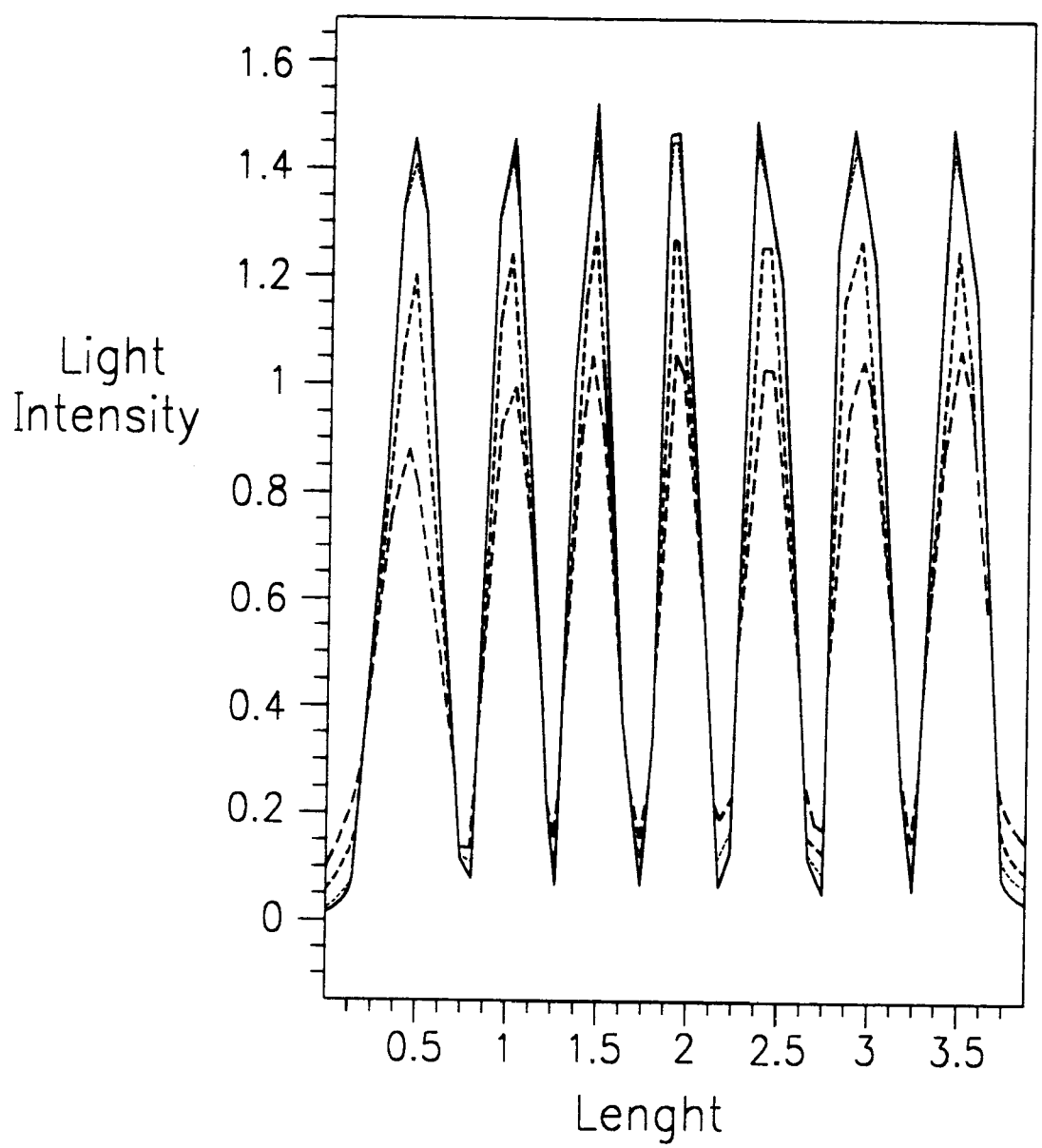
FIG. 4C is a graph illustrating the profile of light intensity exhibited along the line a—a of FIG. 4B.

FIG. 4C is a graph illustrating the profile of light intensity exhibited along the line a—a of FIG. 4B.

Referring to FIG. 4C, it can be found that light from the i line having a wavelength 0.365 $\mu$m and passing through the phase shift mask has a sufficient light contrast to form contact holes at intervals of 0.5 $\mu$m. The light exhibits its highest intensity at the central portion of each phase shift layer pattern 25 and at the central portion of each exposed portion of the quartz substrate 21. The lowest intensity of light is exhibited at the boundary between each phase shift layer pattern 25 and each exposed portion of the quartz substrate 21 arranged adjacent to each other. This boundary serves as a pattern for distinguishing neighboring contact holes from each other. Four different lines in FIG. 4C show light intensity distributions respectively established at the defocus of 0, 0.3, 0.6 and 0.9 $\mu$m.

As apparent from the above description, the present invention provides a contact mask having a plurality of uniformly spaced square phase shift layer patterns formed on a quartz substrate such that portions of quartz substrate having the same size as the phase shift layer patterns are exposed while being uniformly spaced. With such a structure, the contact mask can form a photoresist film pattern capable of forming contact holes having a micro dimension. Accordingly, the present invention provides an advantage that highly integrated semiconductor devices can be fabricated.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A contact mask for forming contact holes comprising:

a quartz substrate;

a chromium pattern formed on the quartz substrate and provided with a plurality of horizontally elongated and vertically uniformly spaced slots each having a desired width; and a plurality of uniformly spaced phase shift layer patterns formed on a portion of the quartz substrate exposed through each of the slots wherein the phase shift layer patterns and exposed portions of the quartz substrate are alternatively arranged in both the horizontal and vertical directions.

2. A contact mask for forming contact holes in accordance with claim 1, wherein each of the phase shift layer patterns have a line width larger than the wavelength of a light source used in a light exposure procedure.

3. A contact mask for forming contact holes comprising:

a quartz substrate;

a chromium pattern formed on the quartz substrate and provided with a plurality of horizontally elongated and vertically uniformly spaced slots each having a desired width; and a plurality of uniformly spaced phase shift layer patterns formed on a portion of the quartz substrate exposed through each of the slots, each of the phase shift layer patterns having a line width larger than the wavelength of a light source used in a light exposure procedure wherein the phase shift layer patterns formed at each slot of the chromium pattern are vertically aligned with those formed at other slots of the chromium pattern and are alternately arranged with uncoated portions of the quartz substrate.

4. A contact mask for forming contact holes comprising:

a quartz substrate;

a chromium pattern formed on the quartz substrate and provided with a plurality of horizontally elongated and vertically uniformly spaced slots each having a desired width; and a plurality of uniformly spaced phase shift layer patterns formed on a portion of the quartz substrate exposed through each of the slots, each of the phase shift layer patterns having a line width larger than the wavelength of a light source used in a light exposure procedure wherein the phase shift layer patterns formed at each slot of the chromium pattern are vertically aligned with those formed at every second slot of the chromium pattern and are alternately arranged with uncoated portions of the quartz substrate.

* * * * *